United States Patent
Jackson et al.

(10) Patent No.: US 6,563,300 B1
(45) Date of Patent: May 13, 2003

(54) METHOD AND APPARATUS FOR FAULT DETECTION USING MULTIPLE TOOL ERROR SIGNALS

(75) Inventors: Timothy L. Jackson, Pflugerville, TX (US); Richard J. Markle, Austin, TX (US); Edward C. Stewart, Buda, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 78 days.

(21) Appl. No.: 09/832,781

(22) Filed: Apr. 11, 2001

(51) Int. Cl.[7] .............................................. G01R 31/00
(52) U.S. Cl. .................... 324/158.1; 324/765; 700/121; 707/104.1; 364/468.17
(58) Field of Search ................................. 324/754, 763, 324/757, 158.1, 73.1; 438/16, 18, 14; 364/468.28, 552; 707/104.1; 700/121, 120

(56) References Cited

U.S. PATENT DOCUMENTS 5,761,064 A * 6/1998 La et al. ................. 364/468.17
5,913,105 A * 6/1999 McIntyre et al. ............. 438/16
6,430,572 B1 * 8/2002 Steffan et al. ................ 438/14

\* cited by examiner

*Primary Examiner*—Kamand Cuneo
*Assistant Examiner*—Jimmy Nguyen
(74) *Attorney, Agent, or Firm*—Williams, Morgan & Amerson, P.C.

(57) ABSTRACT

A method for detecting faults in a manufacturing line includes processing a plurality of workpieces in a plurality of tools; generating a first error signal associated with the workpieces based on the processing performed in a first tool of the plurality of tools; generating a second error signal associated with the workpieces based on the processing performed in a second tool of the plurality of tools; combining the first and second error signals to generate a composite error signal; and identifying a fault condition with the workpieces based on the composite error signal. A manufacturing system includes a plurality of tools adapted to process workpieces, and a fault monitor. The fault monitor is adapted to receive a first error signal associated with the workpieces based on the processing performed in a first tool of the plurality of tools, receive a second error signal associated with the workpieces based on the processing performed in a second tool of the plurality of tools, combine the first and second error signals to generate a composite error signal, and identify a fault condition with the workpieces based on the composite error signal.

52 Claims, 3 Drawing Sheets

METHOD AND APPARATUS FOR FAULT DETECTION USING MULTIPLE TOOL ERROR SIGNALS

BACKGROUND OF THE INVENTION

1. Field of the Invention

This invention relates generally to the field of semiconductor device manufacturing and, more particularly, to a method and apparatus for fault detection using multiple tool error signals.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of fabrication steps is performed on a lot of wafers using a variety of tools, including photolithography steppers, etch tools, deposition tools, polishing tools, rapid thermal processing tools, implantation tools, etc. The performance of the fabrication steps is also typically measured by metrology tools, such as scanning electron microscopes, optical measurement tools, electrical test tools, etc. The technologies underlying semiconductor fabrication and metrology tools have attracted increased attention over the last several years, resulting in substantial refinements. However, despite the advances made in this area, many of the tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical fabrication or metrology parameters, such as throughput, accuracy, stability and repeatability, fabrication temperatures, mechanical tool parameters, wafer state measurements/results, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of semiconductor processing line includes using a factory wide control system to automatically control the operation of the various fabrication and metrology tools. The manufacturing tools communicate with a manufacturing framework or a network of processing modules. Each tool is generally connected to an equipment interface. The equipment interface is connected to a machine interface which facilitates communications between the tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple tools for multiple fabrication processes and associated metrology measurements, generating data relating to the quality of the processed semiconductor devices.

During the fabrication process various events may take place that affect the performance of the devices. That is, variations in the fabrication steps result in device performance variations. Factors, such as feature critical dimensions, doping levels, contact resistance, particle contamination, etc., all may potentially affect the end performance of the device. Various tools in the processing line are controlled in accordance with performance models to reduce fabrication and metrology measurement variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Statistical process control techniques are commonly used to monitor the operation of manufacturing processes, systems, or individual tools. Commonly, various measurements related to the process being monitored are compiled and plotted on a control chart. The control chart has control limits, which, if violated, immediately indicate an error condition requiring investigation. Certain error conditions result from special causes, such as a defective tool, operator error, material defect, process changes, trends, etc., that may be corrected by process optimization or redesign.

In some instances error conditions are present, yet go undetected. The error signal may not be significantly strong to rise above the threshold set for detection. An error signal may also be masked by measurement detection limitations and noise. Undetected faults can lead to misprocessed wafers, which require rework or may even need to be scrapped. Misprocessed wafers are costly and reduce the efficiency of the processing line.

The present invention is directed to overcoming, or at least reducing the effects of, one or more of the problems set forth above.

SUMMARY OF THE INVENTION

One aspect of the present invention is seen in a method for detecting faults in a manufacturing line. The method includes processing a plurality of workpieces in a plurality of tools; generating a first error signal associated with the workpieces based on the processing performed in a first tool of the plurality of tools; generating a second error signal associated with the workpieces based on the processing performed in a second tool of the plurality of tools; combining the first and second error signals to generate a composite error signal; and identifying a fault condition with the workpieces based on the composite error signal.

Another aspect of the present invention is seen in a manufacturing system including a plurality of tools adapted to process workpieces, and a fault monitor. The fault monitor is adapted to receive a first error signal associated with the workpieces based on the processing performed in a first tool of the plurality of tools, receive a second error signal associated with the workpieces based on the processing performed in a second tool of the plurality of tools, combine the first and second error signals to generate a composite error signal, and identify a fault condition with the workpieces based on the composite error signal.

BRIEF DESCRIPTION OF THE DRAWINGS

The invention may be understood by reference to the following description taken in conjunction with the accompanying drawings, in which like reference numerals identify like elements, and in which.

Figure 1:
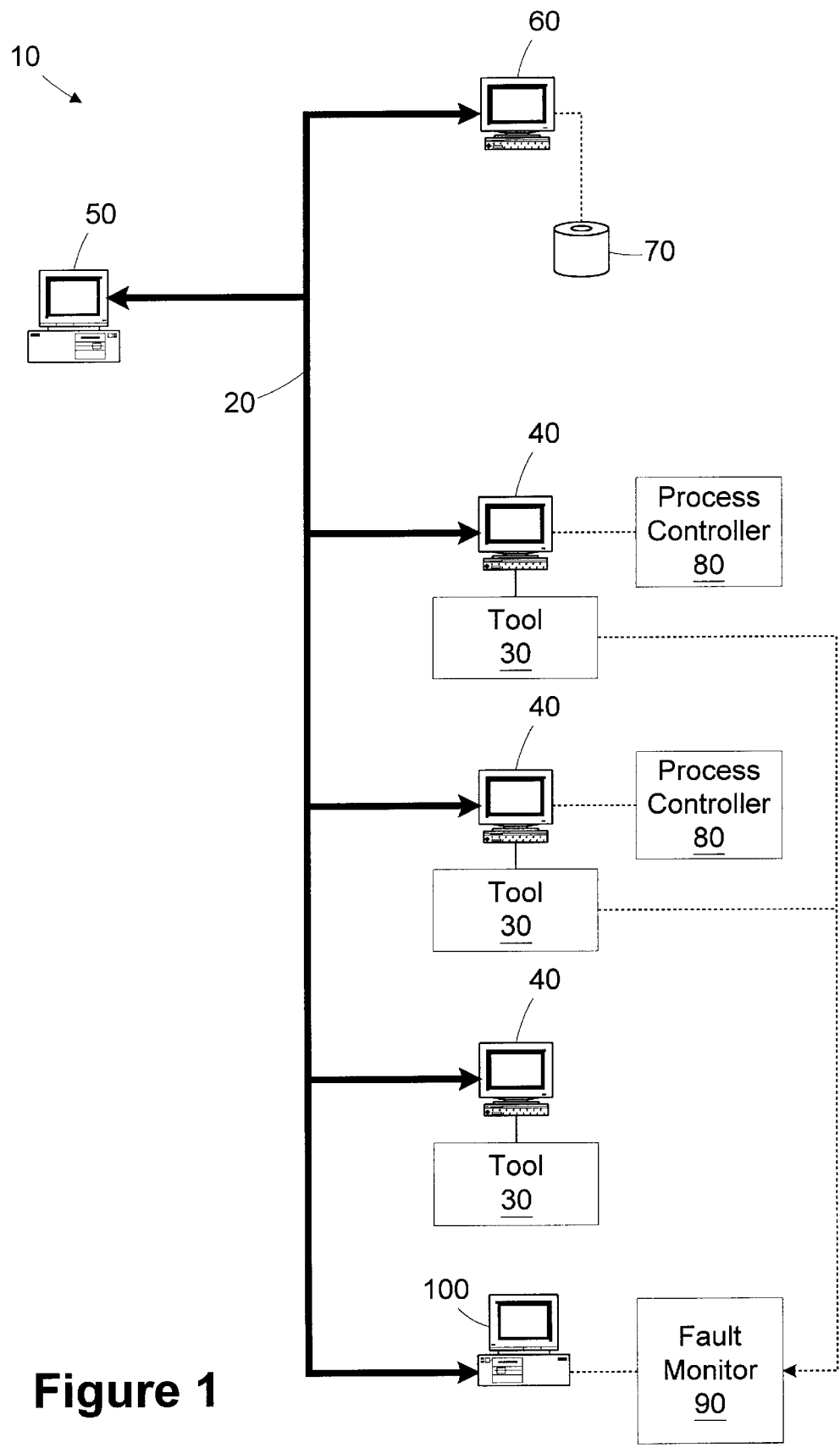
FIG. 1 is a simplified block diagram of an illustrative manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system is adapted to process semiconductor wafers, however, the invention is not so limited and may be applied to other types of manufacturing environments and other types of workpieces. A network 20 interconnects various components of the manufacturing system, allowing them to exchange information. The illustrative manufacturing system 10 includes a plurality of tools 30, each being coupled to a computer 40 for interfacing with the network 20.

A process control server 50 directs the high level operation of the manufacturing system 10 by directing the process flow of the manufacturing system 10. The process control server 50 monitors the status of the various entities in the manufacturing system, including the tools 30. The tools may be fabrication tools, such as photolithography steppers, etch tools, deposition tools, polishing tools, rapid thermal processing tools, implantation tools, etc., or metrology tools for measuring characteristics of the wafers being processed in the manufacturing system 10.

A database server 60 is provided for storing data related to the status of the various entities and workpieces (e.g., wafers) in the process flow. The database server 60 may store information in one or more data stores 70. The data may include pre-process and post-process metrology data, tool states, process flow activities (e.g., scheduled maintenance events, processing routes for lots of wafers), etc. The distribution of the processing and data storage functions amongst the different computers 40, 50, 60 is generally conducted to provide independence and a central information store. Of course, more or less computers may be used.

Typically, each wafer processed (i.e., by a fabrication tool or a metrology tool) in the manufacturing system 10 has a unique wafer identification code (wafer ID). Wafers are processed in groups, referred to as lots. Each lot also has a unique identification code (lot ID). Each lot is typically exposed to the same fabrication or measuring conditions and recipes as it passes through the manufacturing system 10, hence the members of a particular lot have generally similar characteristics.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or "measuring" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Some of the tools 30 include process controllers 80 that are adapted to automatically control the operating recipes (i.e., process or metrology) of their respective tools 30. A particular tool 30 may have more than one process controller 80 adapted to control more than one operating recipe parameter. For example, if the tool 30 is a CMP tool, the process controller 80 may receive pre-polish thickness measurements (e.g., thickness of high features, thickness of low features) and predict a polishing time required to achieve a post-polish target thickness. In the case where the tool 30 is an etch tool, the process controller 80 may model the etching performance of the tool 30 based on pre-etch and/or post-etch thickness measurements. The process controller 80 may use a control model of the tool 30 to generate its prediction. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected. Using the control model, the process controller 80 may determine operating recipe parameters such as etch time, plasma power, temperature, pressure, reactant gas concentrations, etc. to reduce post-etch thickness variations. Other control scenarios are possible with other types of tools 30.

The manufacturing system 10 also includes a fault monitor 90 operating on a workstation 100 for detecting fault conditions on the wafers being processed. The fault monitor 90 may access the metrology data collected regarding the performance of the tools 30 and the overall manufacturing system 10 that is stored on the database server 60 in the data store 70 to generate error signals for the tools 30. The fault monitor 90 detects fault conditions by combining error signals from multiple tools to generate a composite error signal having an increased strength.

Figure 2:
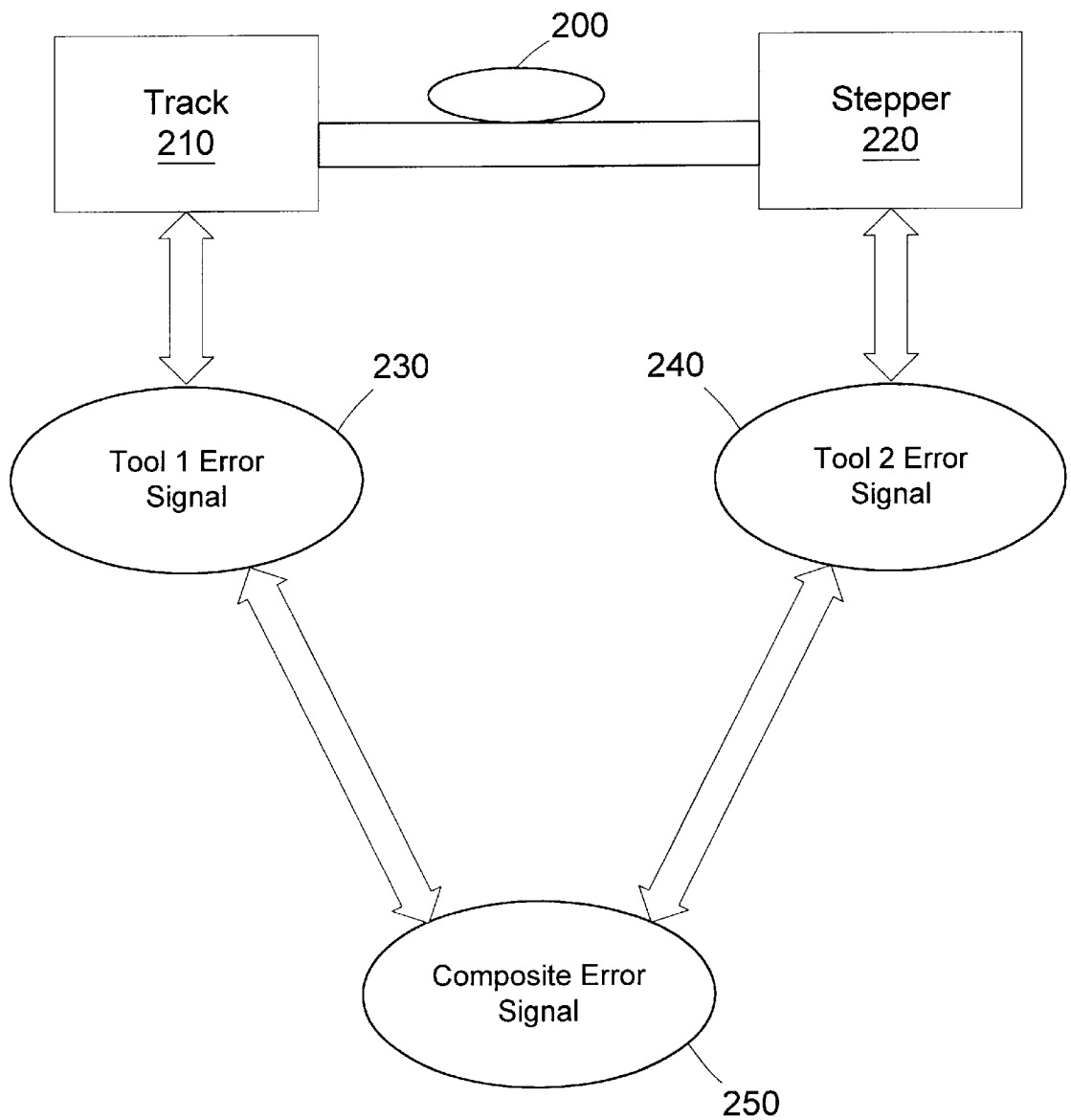
FIG. 2 is a simplified functional diagram illustrating the technique used by a fault monitor of the system of FIG. 1 to combine error signals from multiple tools.

The invention is described as it may be implemented for detecting wafers that are misprocessed during photolithography patterning. However, the invention is not so limited, as it may be applied to other multiple tool applications. In a photolithography patterning process illustrated in FIG. 2, a wafer 200 is first processed in a wafer track 210 that is coupled to a stepper 220. The wafer track 210 spins photoresist material onto the wafer 200 and pre-bakes the photoresist layer. The stepper 220 exposes the photoresist layer to form a pattern in the photoresist layer. The wafer track 210 then performs a post-exposure bake (i.e., if necessary for the type of photoresist layer used) and applies a developer solution to remove the exposed portions of the photoresist layer (i.e., for a positive-type photoresist material).

The fault monitor 90 analyzes and combines error signals from the wafer track 210 and the stepper 220 to detect misprocessed wafers 200. The error signal from one of the tools 210, 220 may not be sufficient to identify a misprocessed wafer 200, but if the error signals are combined the misprocessed wafer 200 may be apparent. The particular types of errors used to generate the error signal, and the type of signal may vary. Exemplary error signals 230 generated by the wafer track 210 may be based on a photoresist dispense flow rate, a spin speed, a hot plate temperature, a developer solution flow rate, a solvent flow rate, a deionized water flow rate, an exhaust gas flow rate, a dispense atmosphere environment variable (e.g., temperature or humidity), a post-exposure bake environment variable (e.g., humidity), etc. Exemplary error signals 240 generated by the stepper 220 may be based on a focus parameter, a leveling parameter, an exposure dose, a lens temperature, an alignment parameter, and a stepper environment variable (e.g., barometric pressure, temperature, humidity, etc.). Error signals may also be generated based on metrology data. For example, the critical dimensions (e.g., width, sidewall angle, etc.) of the features formed based on the pattern generated by the stepper 230 may be measured by a scanning electron microscope and used to generate an error signal.

The manner in which the fault monitor 90 combines the error signals 230, 240 to generate a composite error signal 250 may vary depending on the particular makeup of the error signal. In one embodiment, the error signal may be a binary indication of a potential error for a particular wafer ID or lot ID. For example, one of the wafer track 210 parameters, such as photoresist dispense flow rate, spin speed, hot plate temperature, developer solution flow rate, solvent flow rate, deionized water flow rate, exhaust gas flow rate, dispense atmosphere environment conditions, post-exposure bake environment conditions, etc., may be outside a normal operating range. Such variations could result in a photoresist layer that is thicker than anticipated or has a non-uniform thickness (e.g., thicker on the periphery of wafer than in the middle). However, a thickness or uniformity variation may not always correlate to a fault condition for the particular wafer. The fault monitor 90 receives the error signal 230 from the wafer track 210. The error signal 230 essentially comprises a flag for the particular wafer ID or lot ID indicating the potential error. The stepper 220 may also generate an error signal 240 for a particular wafer if an irregularity is seen in a focus parameters, a leveling parameter, an exposure dose, a lens temperature, an alignment parameter, or a stepper environment variable. Again, such an irregularity might not always indicate a fault condition. In some cases though, a photoresist thickness variation can cause leveling problems in the stepper 220. Similarly, a photoresist layer uniformity deviation can cause focus problems in the stepper 220. The fault monitor 90 receives the individual error signals 230, 240 and generates the composite error signal 250 by intersecting the error signals (i.e., based on wafer ID or lot ID) to identify a subset of wafers 200 that experienced error conditions in both tools 210, 220.

An error signal 230, 240 from one of the tools 210, 220 may also be combined with an error signal (not shown) generated from metrology data to generate the composite error signal 250. For example, CD measurements (e.g., width, sidewall angle, etc.) of features, such as transistor gate electrodes, formed on the wafer 200 may be combined with an error signal generated by one of the tools 210, 220 indicative of a photoresist a layer thickness or uniformity deviation. The CD measurements may indicate that the sidewall angle or the width of the feature, although within specification limits, may be indicative of a fault condition when combined with the tool error signal 230, 240.

The composite error signal 250 provides an increased accuracy indication of a misprocessed wafer fault. Corrective actions may then be taken to rework the misprocessed wafer(s) prior to expending additional resources on subsequent process steps.

In another embodiment, the fault monitor 90 might receive the error signals 230, 240 in the form of raw data and correlate the raw data to error probabilities. The error probabilities from each tool (i.e., the likelihood that a fault will occur due to a particular processing environment defined by the raw data) may be combined to generate the composite error signal 250. Models of the tools 210, 220 may be generated for correlating the raw data to error probabilities. Raw metrology data may also be correlated to generate error probabilities. For example, an error probability may be determined for a particular temperature. Larger temperature deviations will have higher associated error probabilities. To generate the error probabilities a relatively simple equation based error model (e.g., linear, exponential, weighted average, etc.) or a more complex error model, such as a neural network model, principal component analysis (PCA) model, or a projection to latent structures (PLS) model may be used. Fuzzy number theory provides an exemplary framework for expressing the error probabilities. The error signal 230, 240 from each tool 210, 220 may be represented as fuzzy numbers, which may be combined using techniques well-known in the art to generate the composite error signal 250.

In still another embodiment, one of the error signals 230, 240 may be used as a filter for identifying wafers 200 or lots having a potential fault condition. For example, the error signal 240 from the stepper 220 may represent a binary indication of those wafer or lot IDs that experienced a leveling problem. The error signal 240 may then be used to filter raw data provided in the error signal 230 from the wafer track 210. The filtered raw data may then be analyzed on a control chart to identify wafers 200 with higher fault probabilities. If filtering were not used, the raw data would include data for all of the wafers processed by the wafer track 210. An fault condition may be masked due to the large quantity of data. The control limit that is set high enough to account for normal process variation may be too high to identify the fault. However, with the case of the filtered data, it is already known that a higher potential for a fault condition is present, and a more stringent control limit may be applied. Certain wafers that deviate only marginally may still pass, but other misprocessed wafers may be selected for rework based on the lower control limit.

Figure 3:
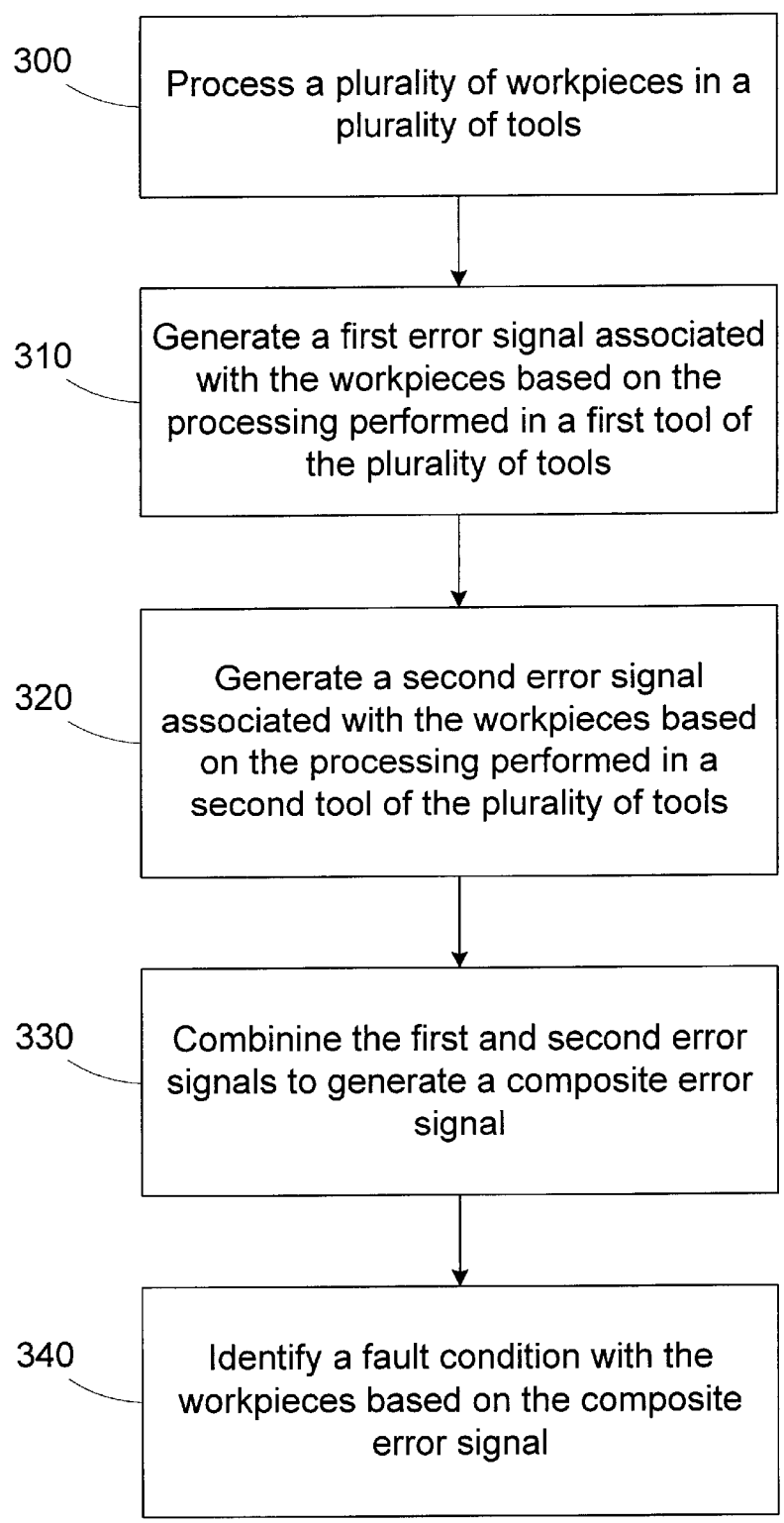
FIG. 3 is a simplified flow diagram of a method for detecting faults using multiple tool error signals in accordance with another illustrative embodiment of the present invention.

Turning now to FIG. 3, a simplified flow diagram of a method for detecting faults using multiple tool error signals in accordance with another illustrative embodiment of the present invention is provided. In block 300, workpieces, such as semiconductor wafers, are processed in a plurality of tools. The term "processed" is used herein to denote both the performance of fabrication steps and/or metrology steps. In block 310, a first error signal associated with the workpieces is generated based on the processing performed in a first tool of the plurality of tools. In block 320, a second error signal associated with the workpieces is generated based on the processing performed in a second tool of the plurality of tools. The first and second error signals may comprise binary indications of an error condition, error probabilities, raw tool or metrology data, or some combination thereof. In block 330, the first and second error signals are combined to generate a composite error signal. Combining the error signals may include combining the binary indications, combining error probabilities filtering one of the error signals based on the other, etc. In block 340, a fault condition with the workpieces is identified based on the composite error signal.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method for detecting faults in a manufacturing line, comprising:

processing a plurality of workpieces in a plurality of tools;

generating a first error signal associated with the workpieces based on the processing performed in a first tool of the plurality of tools;

generating a second error signal associated with the workpieces based on the processing performed in a second tool of the plurality of tools;

combining the first and second error signals to generate a composite error signal; and identifying a fault condition with the workpieces based on the composite error signal.

2. The method of claim 1, wherein identifying the fault condition comprises identifying a control limit violation in the composite error signal.

3. The method of claim 1, wherein the first error signal comprises error information indexed by a workpiece identification code, the second error signal comprises error information indexed by the workpiece identification code, and combining the first and second error signals comprises combining the error information for workpieces having the same workpiece identification code in the first and second error signals.

4. The method of claim 1, wherein generating the first error signal comprises generating a first binary indication that an error condition occurred during the processing in the first tool, generating the second error signal comprises generating a second binary indication that an error condition occurred during the processing in the second tool, and combining the first and second error signals to generate the composite error signal comprises combining the first and second error signals using a logical AND combination.

5. The method of claim 1, wherein generating the first error signal comprises generating a first error probability for each of the workpieces, generating the second error signal comprises generating a second error probability for each of the workpieces, and combining the first and second error signals to generate the composite error signal comprises adding the first and second error probabilities for each of the workpieces.

6. The method of claim 5, wherein identifying the fault condition comprises identifying the fault condition in response to the sum of the first and second error probabilities being greater than a predetermined threshold.

7. The method of claim 1, wherein generating the first error signal comprises generating processing data related to the processing of the workpieces in the first tool, generating the second error signal comprises generating a binary indication that an error condition occurred during the processing of the workpieces in the second tool, and combining the first and second error signals to generate the composite error signal comprises filtering the first error signal based on the second error signal.

8. The method of claim 7, wherein identifying the fault condition comprises identifying a control limit violation in the composite error signal.

9. The method of claim 1, wherein the first tool comprises a wafer track, and generating the first error signal comprises generating the first error signal based on at least one of a photoresist dispense flow rate, a spin speed, a hot plate temperature, a developer solution flow rate, a solvent flow rate, a deionized water flow rate, an exhaust gas flow rate, a dispense atmosphere environment variable, and a post-exposure bake environment variable.

10. The method of claim 9, wherein the second tool comprises a photolithography stepper, and generating the second error signal comprises generating the second error signal based on at least one of a focus parameter, a leveling parameter, an exposure dose, a lens temperature, an alignment parameter, and a stepper environment variable.

11. A method for detecting faults in a manufacturing line for processing semiconductor wafers, comprising:
   processing a plurality of wafers in a wafer track tool;
   generating a first error signal associated with the wafers based on the processing performed in the wafer track tool;
   processing the plurality of wafers in a photolithography stepper;
   generating a second error signal associated with the wafers based on the processing performed in the photolithography stepper;
   combining the first and second error signals to generate a composite error signal; and
   identifying a fault condition with the wafers based on the composite error signal.

12. The method of claim 11, wherein generating the first error signal comprises generating the first error signal based on at least one of a photoresist dispense flow rate, a spin speed, a hot plate temperature, a developer solution flow rate, a solvent flow rate, a deionized water flow rate, an exhaust gas flow rate, a dispense atmosphere environment variable, and a post-exposure bake environment variable.

13. The method of claim 11, wherein generating the second error signal comprises generating the second error signal based on at least one of a focus parameter, a leveling parameter, an exposure dose, a lens temperature, an alignment parameter, and a stepper environment variable.

14. The method of claim 11, wherein identifying the fault condition comprises identifying a control limit violation in the composite error signal.

15. The method of claim 11, wherein the first error signal comprises error information indexed by a wafer identification code, the second error signal comprises error information indexed by the wafer identification code, and combining the first and second error signals comprises combining the error information for wafers having the same wafer identification code in the first and second error signals.

16. The method of claim 11, wherein generating the first error signal comprises generating a first binary indication that an error condition occurred during the processing in the wafer track tool, generating the second error signal comprises generating a second binary indication that an error condition occurred during the processing in the photolithography stepper, and combining the first and second error signals to generate the composite error signal comprises combining the first and second error signals using a logical AND combination.

17. The method of claim 11, wherein generating the first error signal comprises generating a first error probability for each of the wafers, generating the second error signal comprises generating a second error probability for each of the wafers, and combining the first and second error signals to generate the composite error signal comprises adding the first and second error probabilities for each of the wafers.

18. The method of claim 17, wherein identifying the fault condition comprises identifying the fault condition in response to the sum of the first and second error probabilities being greater than a predetermined threshold.

19. The method of claim 11, wherein generating the first error signal comprises generating processing data related to the processing of the wafers in the wafer track tool, generating the second error signal comprises generating a binary indication that an error condition occurred during the processing of the wafers in the photolithography stepper, and combining the first and second error signals to generate the composite error signal comprises filtering the first error signal based on the second error signal.

20. The method of claim 19, wherein identifying the fault condition comprises identifying a control limit violation in the composite error signal.

21. The method of claim 11, wherein generating the first error signal comprises generating the first error signal based on a photoresist layer thickness, generating the second error signal comprises generating the second error signal based on a leveling parameter, and combining the first and second error signals comprises identifying the wafers having a deviation in the photoresist layer thickness and a deviation in the leveling parameter.

22. The method of claim 11, wherein generating the second error signal comprises generating the second error signal based on at least one of a focus parameter, a leveling parameter, an exposure dose, a lens temperature, an alignment parameter, and a stepper environment variable.

23. The method of claim 11, wherein generating the first error signal comprises generating the first error signal based on a photoresist layer uniformity, generating the second error signal comprises generating the second error signal based on a focus parameter, and combining the first and second error signals comprises identifying the wafers having a deviation in the photoresist layer uniformity and a deviation in the focus parameter.

24. A method for detecting faults in a manufacturing line, comprising:
   processing a plurality of workpieces in a plurality of tools;
   generating a first error signal associated with the workpieces based on the processing performed in a first tool of the plurality of tools, the first error signal comprising processing data;
   generating a second error signal associated with the workpieces based on the processing performed in a second tool of the plurality of tools, the second error signal comprising a binary indication that an error condition occurred during the processing of the wafers in the second tool;
   combining the first and second error signals to generate a composite error signal by filtering the first error signal based on the second error signal; and
   identifying a fault condition with the workpieces based on the composite error signal.

25. The method of claim 24, wherein identifying the fault condition comprises identifying a control limit violation in the composite error signal.

26. A manufacturing system, comprising:
   a plurality of tools adapted to process workpieces; and
   a fault monitor adapted to receive a first error signal associated with the workpieces based on the processing performed in a first tool of the plurality of tools, receive a second error signal associated with the workpieces based on the processing performed in a second tool of the plurality of tools, combine the first and second error signals to generate a composite error signal, and identify a fault condition with the workpieces based on the composite error signal.

27. The system of claim 26, wherein the fault monitor is adapted to identify the fault condition by identifying a control limit violation in the composite error signal.

28. The system of claim 26, wherein the first error signal comprises error information indexed by a workpiece identification code, the second error signal comprises error information indexed by the workpiece identification code, and the fault monitor is adapted to combine the first and second error signals by combining the error information for workpieces having the same workpiece identification code in the first and second error signals.

29. The system of claim 26, wherein the first error signal comprises a first binary indication that an error condition occurred during the processing in the first tool, the second error signal comprises a second binary indication that an error condition occurred during the processing in the second tool, and the fault monitor is adapted combine the first and second error signals to generate the composite error signal using a logical AND combination.

30. The system of claim 26, wherein the first error signal comprises a first error probability for each of the workpieces, the second error signal comprises a second error probability for each of the workpieces, and the fault monitor is adapted combine the first and second error signals to generate the composite error signal by adding the first and second error probabilities for each of the workpieces.

31. The system of claim 30, wherein the fault monitor is adapted identify the fault condition in response to the sum of the first and second error probabilities being greater than a predetermined threshold.

32. The system of claim 26, wherein the first error signal comprises processing data related to the processing of the workpieces in the first tool, the second error signal comprises a binary indication that an error condition occurred during the processing of the workpieces in the second tool, and the fault monitor is adapted combine the first and second error signals to generate the composite error signal by filtering the first error signal based on the second error signal.

33. The system of claim 32, wherein the fault monitor is adapted is adapted to identify the fault condition by identifying a control limit violation in the composite error signal.

34. The system of claim 26, wherein the first tool comprises a wafer track, and the first error signal is based on at least one of a photoresist dispense flow rate, a spin speed, a hot plate temperature, a developer solution flow rate, a solvent flow rate, a deionized water flow rate, an exhaust gas flow rate, a dispense atmosphere environment variable, and a post-exposure bake environment variable.

35. The system of claim 34, wherein the second tool comprises a photolithography stepper, and the second error signal is based on at least one of a focus parameter, a leveling parameter, an exposure dose, a lens temperature, an alignment parameter, and a stepper environment variable.

36. The system of claim 26, further comprising a database server adapted to store processing information related to the processing of the workpieces in the first and second tools in a data store, and the fault monitor is adapted to access the data store to generate the first and second error signals.

37. A manufacturing system, comprising:
a plurality of tools adapted to process workpieces; and
a fault monitor adapted to receive a first error signal associated with the workpieces based on the processing performed in a first tool of the plurality of tools, the first error signal comprising processing data, receive a second error signal associated with the workpieces based on the processing performed in a second tool of the plurality of tools, the second error signal comprising a binary indication that an error condition occurred during the processing of the wafers in the second tool, combine the first and second error signals to generate a composite error signal by filtering the first error signal based on the second error signal, and identify a fault condition with the workpieces based on the composite error signal.

38. The manufacturing system of claim of claim 37, wherein the fault monitor is adapted to identify the fault condition by identifying a control limit violation in the composite error signal.

39. A manufacturing system for processing semiconductor wafers, comprising:
a wafer track tool adapted to process a plurality of wafers;
a photolithography stepper adapted to process the plurality of wafers; and
a fault monitor adapted to receive a first error signal associated with the wafers based on the processing performed in the wafer track tool, receive a second error signal associated with the wafers based on the processing performed in the photolithography stepper, combine the first and second error signals to generate a composite error signal, and identify a fault condition with the wafers based on the composite error signal.

40. The system of claim 39, wherein the first error signal is based on at least one of a photoresist dispense flow rate, a spin speed, a hot plate temperature, a developer solution flow rate, a solvent flow rate, a deionized water flow rate, an exhaust gas flow rate, a dispense atmosphere environment variable, and a post-exposure bake environment variable.

41. The system of claim 39, wherein generating the second error signal is based on at least one of a focus parameter, a leveling parameter, an exposure dose, a lens temperature, an alignment parameter, and a stepper environment variable.

42. The system of claim 39, wherein the fault monitor is adapted to identify the fault condition by identifying a control limit violation in the composite error signal.

43. The system of claim 39, wherein the first error signal comprises error information indexed by a wafer identification code, the second error signal comprises error information indexed by the wafer identification code, and the fault monitor is adapted to combine the first and second error signals for wafers having the same wafer identification code in the first and second error signals.

44. The system of claim 39, wherein the first error signal comprises a first binary indication that an error condition occurred during the processing in the first tool, the second error signal comprises a second binary indication that an error condition occurred during the processing in the second tool, and the fault monitor is adapted to combine the first and second error signals to generate the composite error signal by combining the first and second error signals using a logical AND combination.

45. The system of claim 39, wherein the first error signal comprises a first error probability for each of the wafers, the second error signal comprises a second error probability for each of the wafers, and the fault monitor is adapted to combine the first and second error signals to generate the composite error signal by adding the first and second error probabilities for each of the wafers.

46. The system of claim 45, wherein the fault monitor is adapted to identify the fault condition in response to the sum of the first and second error probabilities being greater than a predetermined threshold.

47. The system of claim 39, wherein the first error signal comprises processing data related to the processing of the wafers in the first tool, the second error signal comprises a binary indication that an error condition occurred during the processing of the wafers in the second tool, and the fault monitor is adapted to combine the first and second error signals to generate the composite error signal by filtering the first error signal based on the second error signal.

48. The system of claim 47, wherein the fault monitor is adapted to identify the fault condition by identifying a control limit violation in the composite error signal.

49. The system of claim 39, wherein the first error signal is based on a photoresist layer thickness, the second error signal is based on a leveling parameter, and the fault monitor is adapted to combine the first and second error signals by identifying the wafers having a deviation in the photoresist layer thickness and a deviation in the leveling parameter.

50. The system of claim 49, further comprising a database server adapted to store processing information related to the processing of the wafers in the wafer track tool and the photolithography stepper in a data store, and the fault monitor is adapted to access the data store to generate the first and second error signals.

51. The system of claim 39, wherein the first error signal is based on a photoresist layer uniformity, the second error signal is based on a focus parameter, and the fault monitor is adapted to combine the first and second error signals by identifying the wafers having a deviation in the photoresist layer uniformity and a deviation in the focus parameter.

52. A manufacturing system, comprising:

means for processing a plurality of workpieces in a plurality of tools;

means for generating a first error signal associated with the workpieces based on the processing performed in a first tool of the plurality of tools;

means for generating a second error signal associated with the workpieces based on the processing performed in a second tool of the plurality of tools;

means for combining the first and second error signals to generate a composite error signal; and means for identifying a fault condition with the workpieces based on the composite error signal.

* * * * *